United States Patent [19]

Min et al.

[11] Patent Number: 4,881,042
[45] Date of Patent: Nov. 14, 1989

[54] AUTOMATICALLY TUNABLE PHASE LOCKED LOOP FM DETECTION SYSTEM

[75] Inventors: Sung-Ki Min, Inchon; Chan-Kyu Myung, Seoul; Ki-Ho Shin, Woolsan, all of Rep. of Korea

[73] Assignee: Samsung Semiconductor and Telecommunications Co., Ltd., Gumi, Rep. of Korea

[21] Appl. No.: 147,433

[22] Filed: Jan. 25, 1988

[30] Foreign Application Priority Data

Jan. 31, 1987 [KR] Rep. of Korea ............ 87-822

[51] Int. Cl.[4] ............................................. H03D 3/02
[52] U.S. Cl. ..................................... 329/326; 331/12; 455/208
[58] Field of Search ...................... 329/50, 122, 124; 331/11, 12; 455/208, 214

[56] References Cited

U.S. PATENT DOCUMENTS 4,580,101  4/1986  Lax .................. 329/124 X

Primary Examiner—Siegfried H. Grimm
Attorney, Agent, or Firm—Ladas & Parry

[57] ABSTRACT

A FM detection system using a phase locked loop (PPL 20) and including: a wave shaping comparator (7) for accepting a signal $V_{CO2}$ from a voltage controlled oscillator (4) which is 90° out of phase with a control signal $V_{CO1}$ from the voltage controlled oscillator (4), the comparator reshaping the signal to a square wave; an in-lock detector (8) for accepting the square wave and a frequency modulated input signal (VFM) to provide a sum frequency and a difference frequency; a low-pass filter (9) cutting off the sum frequency component, and filtering out the difference frequency signal when the PLL (20) is unlocked; a comparator (10) for comparing the output of the low-pass filter (9) with a reference voltage ($V_{REF1}$), and providing a constant logic level when the PLL (20) is locked, or providing a clock pulse corresponding to the difference frequency when the PLL (20) is unlocked; a ripple counter (11) for counting the clock pulse and providing a binary signal output reflective of the count; a D/A converter (12) for accepting the binary output to provide an analogue current; and the oscillation frequency of the voltage controlled oscillator (4) being controlled in response to the output voltage from an amplifier (3) of PLL (20) and the output current of the D/A converter (12). A large detection output is attained in spite of a small loop gain.

2 Claims, 3 Drawing Sheets

AUTOMATICALLY TUNABLE PHASE LOCKED LOOP FM DETECTION SYSTEM

BACKGROUND OF THE INVENTION

This invention relates to improvements of a Phase Locked Loop (PLL hereinafter), Frequency Modulation (FM) detection system and more particularly to an IC automatic tuning PLL FM detection system.

A ceramic discriminator or a detection coil is usually used in conventional audio signal detection systems of T.V. and FM radio receivers. PLL FM detection systems employing an external resistor and capacitor are also used.

A complete integration is impossible in FM detection systems using ceramic discriminators and detection coils. In the PLL FM detection system employing an external resistor and capacitor, a complete integration is also impossible because the external resistor and capacitor must be adjusted externally to match the center frequency of the input signal with the center frequency of the lock range.

It is well known that the total harmonic distortion of demodulated signals increases in the detection of high deviation ratio FM signals using ceramic discriminators and detection coils due to their linear properties. In a conventional PLL FM detection system employing an external resistor and capacitor, the loop gain of the PLL system is increased to obtain wide detectable range, which causes a decrease of detection output and deterioration of the S/N ratio due to externl or internal noise.

SUMMARY OF THE INVENTION

It is the principal object of the invention to provide a PLL FM detection system which can obtain large detection output in spite of small loop gain.

Another object is to provide a wide detection range PLL FM detection system which can change the current of a voltage controlled oscillator (VCO) in response to the output signal of a D/A converter, with the D/A converter accepting the output of a counter which counts the digital signal of the VCO output.

Another object is to provide a monolithically integrated FM detection system which does not need any external tuning components.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
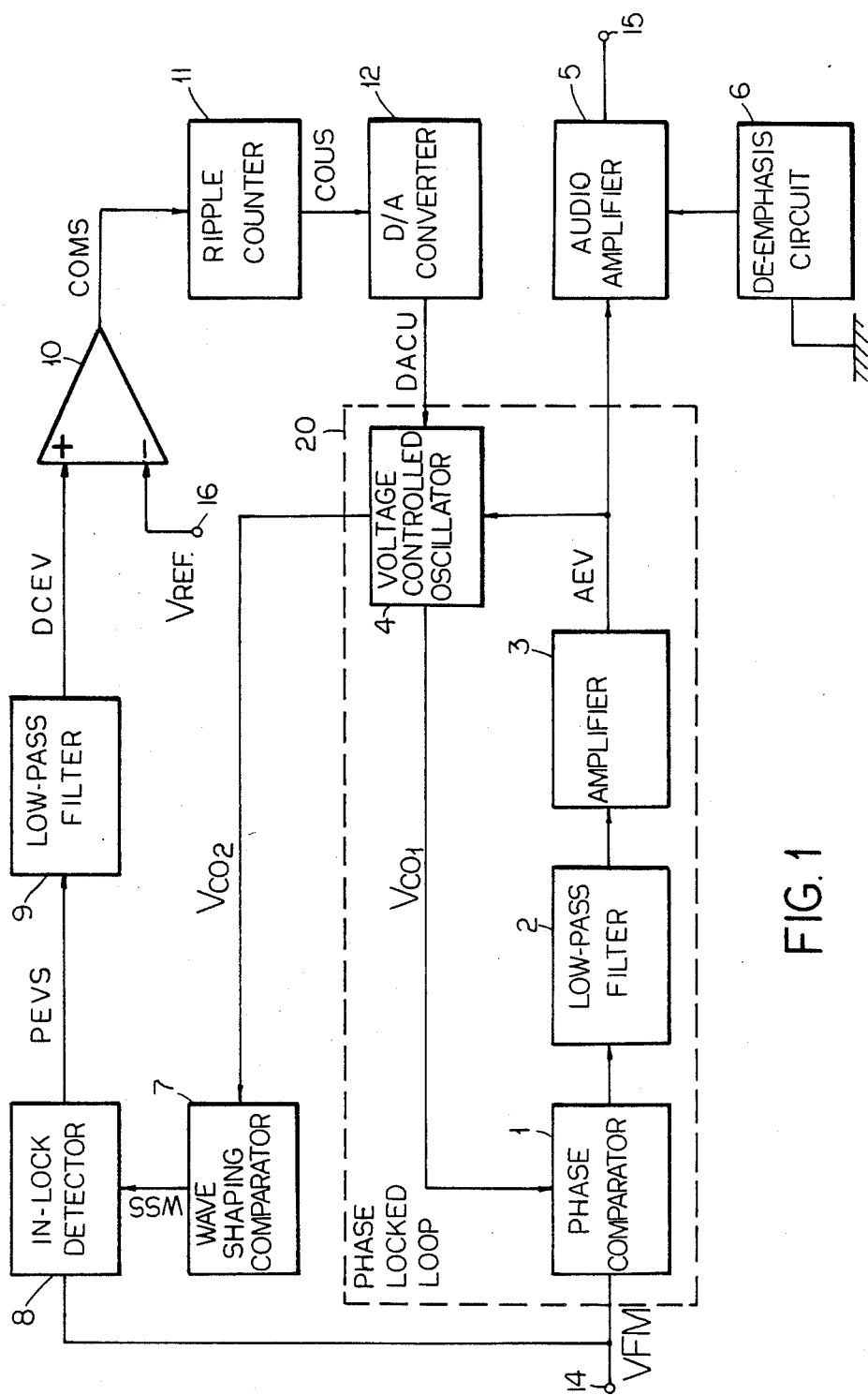
FIG. 1 is a block diagram of the FM detection system of the invention. system of the invention.

Referring to the figures, the invention is explained in detail. FIG. 1 shows an automatic tuning PLL FM detection system which employs a digital-analog converter and a ripple counter in accordance with the invention. The system comprises a phase locked loop 20 which is composed of:

a phase comparator 1 which compares the phases and frequencies, and provides a sum frequency and a difference frequency from a FM modulated signal VFM applied to input terminal 14 and an output signal $V_{CO1}$ provided by a voltage controlled oscillator 4 as explained hereinafter, a low-pass filter 2 which filters out the sum component from the input of the sum signal and the difference signal and provides an error signal corresponding to the difference frequency component and phase difference, an amplifier 3 which provides an amplified error signal AEV from the output signal of the low-pass filter 2, and a voltage controlled oscillator 4 which accepts the error signal AEV from the amplifier 3 as an input, and oscillates in the same frequency and phase as that of the input FM modulated signal VFM.

It is apparent to persons skilled in the art that the amplified error voltage AEV from the amplifier 3 of the PLL 20 is the demodulated signal of the input frequency modulated signal VFM.

It is also common knowledge to persons skilled in the art that the de-emphasis filter 6, which compensates the high frequency range pre-emphasized in the transmitter, and audio amplifier 5 provide the audio output at the output terminal 15 from the FM detection signal AEV in conventional FM audio detection systems.

According to one embodiment of the invention as shown in FIG. 1, when the PLL 20 is locked, the frequency modulated input signal VFM is out of phase with the output signal $V_{CO1}$ of the voltage controlled oscillator 4 by 90°, and the signal $V_{CO1}$ is out of phase with another output signal $V_{CO2}$ of the voltage controlled oscillator 4 by 90°. Therefore, the signal VFM is in phase with the signal $V_{CO2}$.

The circuit described in "Analysis and Design of Analog Integrated Circuits" by Paul R. Gray, Wiley, p574 may be used as the phase comparator 1, and the low-pass filter 2 is a common R-C low-pass filter.

The wave shaping comparator 7 accepts the signal $V_{CO2}$ from the voltage controlled oscillator 4 and reshapes it. That is, the analog signal $V_{CO2}$ is reshaped to a square wave and a wave shaped signal WSS is provided. The in-lock detector 8 is a well known circuit using the same multiplier circuit as that of the phase comparator 1, and provides a signal PEVS generating a sum frequency and a difference frequency from the output signal WSS of the wave shaping comparator 7 and the frequency modulated signal VFM at the input terminal 14.

The low-pass filter 9 filters out the sum frequency component from the signal PEVS, and provides a low frequency signal DCEV corresponding to the difference frequency component.

The comparator 10, which can comprise a known OP amplifier, compares the output signal DCEV of the low-pass filter 9 with a reference voltage $V_{REF\ 1}$ at terminal 16, and provides a digital signal COMS at a certain logic level That is, when the PLL 20 is locked, by choosing the level of reference voltage $V_{REF\ 1}$, the comparator 10 provides a logic 1 or 0 state output, and when the PLL is not locked, the comparator generates a pulse train.

When the PLL 20 is locked, the ripple counter 11 accepts the output signal COMS of the comparator 10 and stops counting the output signal COMS of the comparator 10, and when not locked, the ripple counter 11 counts the pulse-train signal COMS by adopting the up, down or up-down counting mode, and provides a binary counter output signal COUS. The D/A converter 12 accepts the signal COUS, and provides an analog current signal DACU corresponding to the binary input signal COUS.

Therefore, the voltage controlled oscillator 4 accepts the analog current signal DACU, and modifies its free running frequency according to that determined by the current signal.

Figure 2:
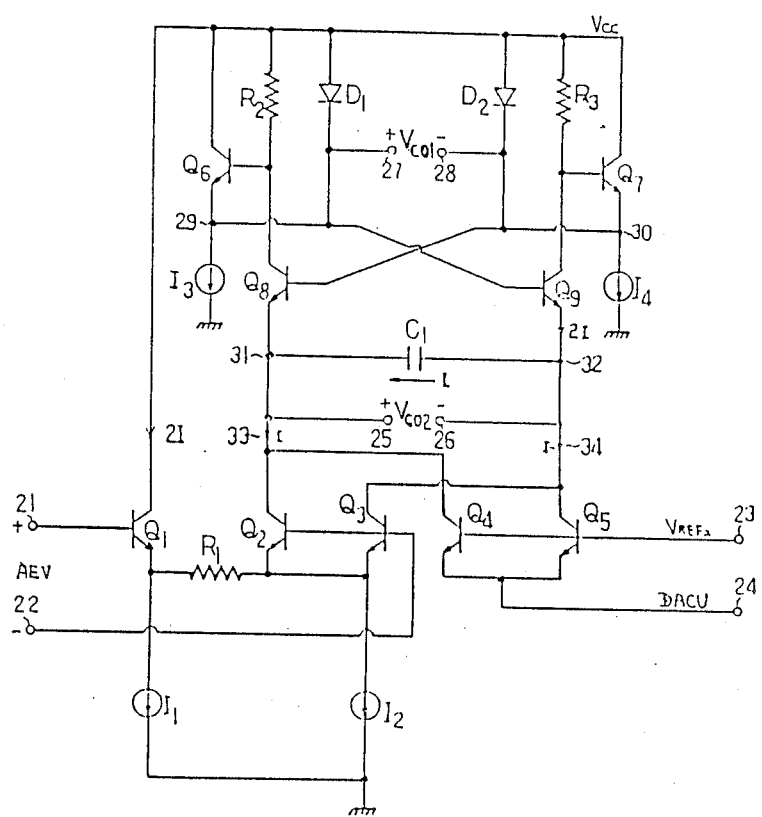
FIG. 2 is a circuit diagram of the voltage controlled oscillator of FIG. 1.

FIG. 2 is the circuit diagram of the voltage controlled oscillator 4 of FIG. 1.

The circuit comprises a pair of gain stages made up of the transistors $Q_8$ and $Q_9$, which are cross coupled through emitter-follower buffer stages $Q_6$ and $Q_7$. Constant current sources $I_3$ and $I_4$ are serially connected with the transistors $Q_6$ and $Q_7$, respectively, between the emitters of the transistor $Q_6$ and $Q_7$ and earth. The gain stages have equal load resistors $R_2$ and $R_3$, which are placed between a voltage supply $V_{CC}$ and the collectors of the transistors $Q_8$ and $Q_9$, and are respectively connected between the collectors and the bases of the buffer stages $Q_6$ and $Q_7$, and connected to one terminal of clamping diodes $D_1$ and $D_2$, respectively. The emitters of the transistors $Q_6$ and $Q_7$ are connected to phase comparator 1 of FIG. 1 through terminals 27 and 28.

The emitters of the transistors $Q_8$ and $Q_9$ are coupled through a timing capacitor $C_1$ which determines the free running frequency of the oscillator by its rate of charge and dischage, and each terminal of the capacitor $C_1$ is connected to the wave shaping comparator 7 in FIG. 1 through terminals 25 and 26.

The emitter terminals of the transistors $Q_8$ and $Q_9$ are connected to the collectors of the transistors $Q_4$ and $Q_5$, respectively. The emitters of the transistors $Q_4$ and $Q_5$ are connected in common to the D/A converter 12 through terminal 24, and a reference voltage $V_{REF\,2}$ is applied to the bases of the transistors $Q_4$ and $Q_5$ through terminal 23. The reference voltage $V_{REF\,2}$, which comes from the-power supply voltage $V_{CC}$ by a resistive voltage divider, biases the transistors $Q_4$ and $Q_5$ to operate in their linear regions.

Also, the emitters of the transistors $Q_8$ and $Q_9$ of the gain stages are connected to the collectors of the transistors $Q_2$ and $Q_3$, respectively, and the emitters of the transistors $Q_2$ and $Q_3$ are connected in common with a constant current source $I_2$, and connected to the emitter of a transistor $Q_1$ through an emitter degeneration resistor $R_1$.

The power supply voltage $V_{CC}$ is applied to the collector of the transistor $Q_1$, and its emitter is connected to constant current source $I_1$. Error signal AEV from the amplifier 3 of the PLL 20 is applied to the base input terminal 21 and the common base input terminal 22 of the transistors $Q_2$ and $Q_3$.

On the other hand, any one of the transistors $Q_8$ and $Q_9$ turns-off at the point of time when one of the transistors $Q_8$ or $Q_9$ turns on, and diodes $D_1$ and $D_2$ clamp the voltage swing across load resistors $R_2$ and $R_3$ to $V_{BE}$ (forward turn-on voltage of Diode $D_1$ or $D_2$)

The voltage controlled oscillator 4 operates as follows.

The oscillation frequency of the voltage controlled oscillator 4 is determined by the output from the amplifier 3 connected to the terminals 21 and 22, and the amount of turning on of the emitter of transistor $Q_8$, $Q_9$ which is reverse-driving the transistor.

If it is assumed that the transistor $Q_8$ of the gain stages is in the off state and the transistor $Q_9$ is turned on, $V_{CC}$-$V_{BE}$ is applied to the base of the buffer stage $Q_7$, and $V_{CC}$-$2V_{BE}$ is applied to the emitter node point 30. Since the transistor $Q_8$ is in the off state, $V_{CC}$ is applied to the base of the transistor $Q_6$, and the node point 29 is $1V_{BE}$ below $V_{CC}$ and the emitter node point 32 is $2V_{BE}$ below $V_{CC}$.

Therefore, current I flows, charging capacitor $C_1$, from the emitter of the transistor $Q_9$ to the emitter of the transistor $Q_8$. This current causes the voltage level at the node point 31 to ramp down with a constant slope of $I/C_1$ until the voltage level at the emitter of the transistor $Q_8$ becomes equal to three diode voltage drops below $V_{CC}$. At this point, the transistor $Q_8$ turns on. The resulting current through $D_1$ causes the base and emitter voltages of the transistor $Q_6$ to shift down by one diode voltage drop, and the transistor $Q_9$ turns off.

This oscillation continues to repeat itself. Therefore, the output signal $V_{CO1}$ between the terminals 27 and 28 is out of phase with the output signals $V_{CO2}$ between terminals 25 and 26 by 90°, and the oscillation frequency is proportional to the current I.

The general operation is fully described in the bibliography of Gray, Mayor "Analysis and Design of Analogue Integrated Circuit": Wiley P 590–P 593, 1977.

If it is assumed that the transistor $Q_9$ is in the on state (the transistor $Q_8$ being turned off) and $2I$ current flows from the emitter of transistor $Q_9$, then current I flows along the lines 33 and 34, respectively, and $2I$ current flows into the collector of the transistor $Q_1$.

When a large voltage swing is applied between the terminals 21 and 22, the current of the collector and the emitter of the transistor $Q_1$ increases for a half cycle, and the current from the emitter of the transistors $Q_2$ or $Q_5$ is reduced to decrease the frequency of the output signals $V_{CO1}$ and $V_{CO2}$.

When the current sink of the D/A converter 12 connected through terminal 24 is increased, the current along the lines 33 or 34 increases, and the oscillation frequency increases. When the current sink is decreased, the oscillation frequency decreases.

Consequently, the oscillation frequency of the voltage controlled oscillator of FIG. 2 is determined by the output of the amplifier 3 connected to the terminals 21 and 22 in order to supply the output signals $V_{CO2}$ and $V_{CO1}$ to the wave shaping comparator 7 connected to terminals 25 and 26 and to the phase comparator 1 connected to the terminals 27 and 28. Further, when this oscillation frequency lies within the locking range of the frequency of the FM input signal VFM, no output comes from the digital-to-analogue converter 12 connected to the terminal 24, so the centered-frequency of the oscillation frequency becomes fixed to oscillate. Conversely, in the situation when the oscillation frequency goes beyond the frequency range of the FM input signal VFM, the output of the digital-to-analogue converter 12 is applied to the terminal 24 to control the output of the transistors $Q_4$ and $Q_5$, so that the centered-frequency of the oscillation frequency is changed to be locked to the centered-frequency range of the FM input signal VFM.

Figure 3:
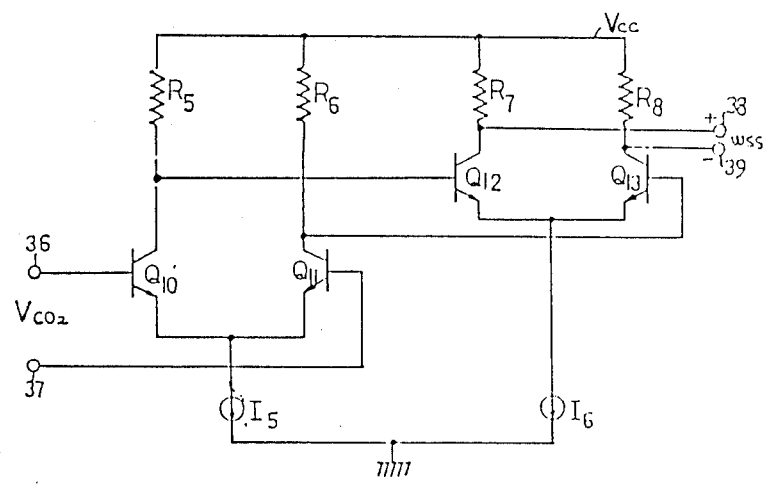
FIG. 3 is a circuit diagram of the wave shaping comparator of FIG. 1.

FIG. 3 shows a circuit diagram of one embodiment of a wave shaping comparator 7. The comparator comprises two differential amplifiers, one of which comprises the resistors $R_5$, $R_6$, the transistors $Q_{10}$ and $Q_{11}$ and the constant current source $I_5$, and the other of which comprises the resistors $R_7$, $R_8$, the transistors $Q_{12}$, $Q_{13}$ and the constant current source $I_6$.

In this circuit, the resistor $R_5$ is equal to $R_6$, and $R_7$ is equal to $R_8$. The output signal $V_{CO2}$ of the voltage controlled oscillator is applied between the input terminals 36 and 37, and its reshaped wave is provided from output terminals 38 and 39.

The D/A converter of the embodiment of the invention shown in FIG. 1 can be the current-scaling D/A converter described in "Bipolar and MOS Analog Integrated Circuit Design" by Alan B. Grevene, Wiley, pp 770–776.

Referring to the figures, the operation of the invention is now explained in detail.

When the frequency modulated input signal VFM and the oscillation signal $V_{CO\,1}$ of the voltage controlled oscillator (VCO) are applied to the phase comparator 1 of FIG. 1, a sum frequency and a difference frequency, two frequency components of VFM and $V_{CO\,1}$, come from the phase comparator 1. The low-pass filter 2 filters out the sum component completely and provides the difference component as its output signal. The amplifier 3 amplifies such output signal, and provides the amplified error signal AEV which modifies the oscillation frequency of the VCO 4 and provides the amplified audio signal at the output terminal 15 as the FM detection output.

When the PLL 20 is locked, and when the center frequency of the frequency modulated input signal VFM is equal to the frequency of the output signal $V_{CO\,1}$ of the $V_{CO\,4}$, the signal VFM is out of phase with $V_{CO\,1}$ by about 90°.

Therefore, the signal $V_{CO\,2}$, which is out of phase with $V_{CO\,1}$ by 90° and is applied between the terminals 25 and 26 of FIG. 2, is in phase with the frequency modulated input signal VFM which is in phase with the signal WSS of the wave shaping comparator 7.

In-lock detector 8, which comprises a conventional multiplier circuit, compares the signal VFM with WSS, and provides a DC voltage including a high frequency beat signal. The high frequency beat signal is filtered out by low-pass filter 9, and the resulting DC voltage is compared with the reference voltage VREF 1 by the comparator 10.

Therefore, when the PLL 20 is locked, the output signal COMS of the comparator 10 remains at a stable 1 or 0 logic state and prevents the ripple counter 11 from operating. The output of the D/A converter 12 which transforms the binary data of the ripple counter 11 into an analog quantity, maintains a stable output level.

That is, when the PLL 20 is locked, the output current DACU of the D/A converter 12, which can change the frequency of the VCO 4, is sufficiently constant to keep the PLL in its locked state and to provide an FM demodulated signal from the output terminal 15.

When the PLL 20 is not locked, the frequency modulated input signal VFM does not keep its phase difference of 90° with the output signal $V_{CO\,1}$ of VCO 4, and it is out of phase with the other output signal $V_{CO\,2}$ of the VCO 4. In other words, the frequency modulated input signal VFM has a different frequency from oscillation signal $V_{CO\,1}$ of the VCO 4.

Therefore, coming from the in-lock detector 8 are two frequency components, a sum frequency and a difference frequency of the frequency modulated input signal VFM and the output signal WSS of the wave shaping comparator 7. The low-pass filter 9 filters out the sum frequency component, and provides frequency component DCEV which is compared with reference voltage $V_{REF\,1}$ by the comparator 10, which generates a pulse signal COMS corresponding to the difference frequency signal.

The ripple counter 11 starts counting the pulse signal COMS as its clock pulse. The output binary data of the ripple counter 11 is applied to the input terminal of the D/A converter 12, from which the output current signal DACU is applied to the terminal 24 of FIG. 2 to bring the PLL 20 to the locking rapidly by variation of the current I.

When the PLL 20 is away from locking range, the oscillation frequency of the VCO 4 is forced to be changed in order to come into locking range. As the frequency of the VCO 4 goes into locking ran respect to the frequency modulated input signal VFM, in response to the-output current signal DACU of the D/A converter 12, which changes its value corresponding to the binary output of the ripple counter 11, the phase difference between the two input signals VFM and WSS to the in-lock detector 8, as stated before, is reduced to render the output clock signal COMS of the comparator 10 at a constant logic level. The ripple counter 11 thus discontinues operation, and the output of the D/A converter 12 remains at a constant value to start detecting operation of the PLL 20 again.

Therefore, when the PLL 20 is signal of FIG. 2 is constant, and the oscillation frequency of the VCO 4 is modified by the change of the emitter current of the transistors $Q_1$, $Q_2$ or $Q_3$ according to the input signal AEV on the terminals 21 and 22. When the PLL 20 is not locked, the current terminal 24 of FIG. 2 is changed by ripple counter 11, and the emitter current of the transistors $Q_4$ and $Q_5$ changes in value to modify the oscillation frequency within the necessary range.

Figure 4:
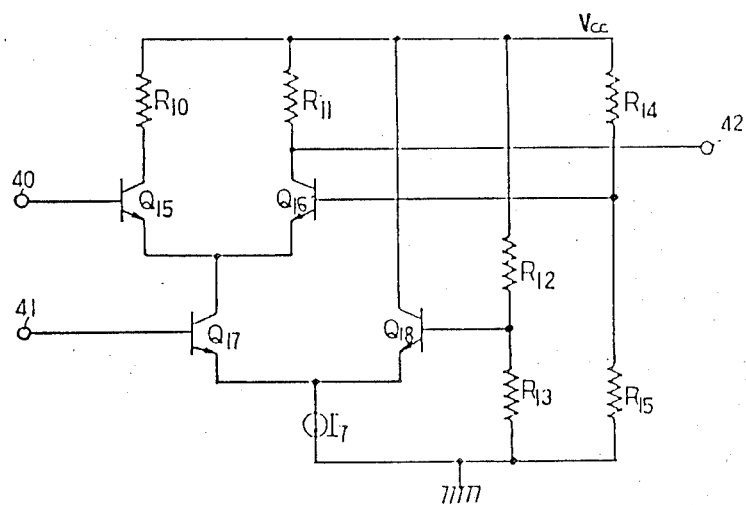
FIG. 4 is a circuit diagram of an embodiment for the input terminal of the ripple counter of the invention.

FIG. 4 is another application of the invention.

The operation of the PLL FM detection system can be controlled as follows.

The output of the comparator 10 in FIG. 1 is connected to terminal 40, and on terminal 41 a logic 1 or logic 0 is respectively applied when detection is being performed or not. The output terminal 42 is connected to the clock pulse input terminal of the ripple counter 11.

The circuit diagram of FIG. 4 is for a two-input-AND gate. When logic 1 is applied on terminal 41, transistor $Q17$ turns on to transmit the logic state from input terminal 40 to output terminal 42. When input terminal 41 is in the logic 0 state, transistor $Q_{17}$ turns off to prevent the transistors $Q_{15}$ and $Q_{16}$ from normal operation, and a logic 1 is provided at the output terminal 42 to cause the ripple counter 11 not to count.

The divided voltages of $V_{CC}$ by resistors $R_{12}$, $R_{13}$ and $R_{14}$, $R_{15}$ are applied on the bases of the transistors $Q_{18}$ and $Q_{16}$ to bias the transistors $Q_{18}$ and $Q_{16}$ in their linear region. The load resistors $R_{10}$ and $R_{11}$ have the same resistance.

As explained previously, the PLL FM detection system of the invention has the advantage of providing stable detection by modifying its locking range with respect to the finite input although the locking range fluctuates due to process instability or aging effects.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

We claim:

1. A FM detection system using a phase locked loop which includes a phase comparator for comparing the phase differences and frequency differences between a frequency modulated input signal and first output signal from a voltage controlled oscillator, a low-pass filter for amplifying and converting the output of said phase comparator into a direct current voltage, an amplifier for amplifying the output of said low-pass filter, the output voltage of said amplifier being an input to an audio amplifier and to said voltage controlled oscillator, said audio amplifier being connected to a de-emphasis circuit, said system further comprising:

a wave shaping comparator for accepting a second output signal form said voltage controlled oscillator which is 90? out of phase with said first output signal from said voltage controlled oscillator, said comparator generating an output square wave signal;

an in-lock detector for accepting as inputs said square wave signal and said frequency modulated input signal to provide an output signal including the sum frequency and the difference frequency between said inputs;

a low-pass filter for receiving the output signal from said detector for cutting off said sum frequency component and filtering out said difference frequency signal when said phase locked loop is unlocked;

a comparator for comparing the output of said low-pass filter with a reference voltage and providing a constant logic level when said phase locked loop is locked, or providing a clock pulse corresponding to said difference frequency when said phase locked loop is unlocked;

a ripple counter for accepting and counting said clock pulse and generating a binary signal output in response to the count made;

a D/A converter for accepting said binary output to provide an anologue current; and the oscillation frequency of said voltage controlled oscillator being controlled in response to said output voltage of said amplifier and said output current of said D/A converter.

2. A system according to claim 1 including an AND gate connected between said comparator and said ripple counter, one of the inputs to said gate being a control logic signal indicative of whether FM detection is being performed, and the other input to said gate being the output from said comparator.

* * * * *